US006996664B2

(12) United States Patent
Giambalvo

(10) Patent No.: US 6,996,664 B2
(45) Date of Patent: Feb. 7, 2006

(54) TERNARY CONTENT ADDRESSABLE MEMORY WITH ENHANCED PRIORITY MATCHING

(75) Inventor: Paul Giambalvo, Middlesex, NJ (US)

(73) Assignee: Micron Technology, Inc., Boise, ID (US)

( * ) Notice: Subject to any disclaimer, the term of this patent is extended or adjusted under 35 U.S.C. 154(b) by 367 days.

(21) Appl. No.: 10/349,796

(22) Filed: Jan. 22, 2003

(65) Prior Publication Data

US 2004/0143701 A1 Jul. 22, 2004

(51) Int. Cl.
*G06F 12/00* (2006.01)
(52) U.S. Cl. ...................................... 711/108; 711/156
(58) Field of Classification Search ................ 711/108, 711/129, 156, 173
See application file for complete search history.

(56) References Cited

U.S. PATENT DOCUMENTS

| | | | |
|---|---|---|---|
| 5,920,886 A | 7/1999 | Feldmeier | 711/108 |
| 5,949,696 A | 9/1999 | Threewitt | 365/49 |
| 6,237,061 B1 * | 5/2001 | Srinivasan et al. | 711/108 |
| 6,266,262 B1 | 7/2001 | Washburn et al. | 365/49 |
| 6,467,019 B1 | 10/2002 | Washburn et al. | 711/108 |
| 6,542,391 B2 | 4/2003 | Pereira et al. | 365/49 |
| 6,542,392 B2 | 4/2003 | Yanagawa | 365/49 |
| 6,615,311 B2 | 9/2003 | Ramakrishnan | 711/108 |
| 6,745,280 B2 | 6/2004 | Darnell et al. | 711/108 |
| 6,804,744 B1 | 10/2004 | Abbas | 711/108 |
| 2002/0075714 A1 | 6/2002 | Pereira et al. | 365/49 |
| 2002/0131432 A1 * | 9/2002 | Bachmutsky et al. | 370/408 |
| 2002/0161969 A1 * | 10/2002 | Nataraj et al. | 711/108 |
| 2002/0188799 A1 | 12/2002 | Ramakrishnan | 711/108 |
| 2003/0028713 A1 * | 2/2003 | Khanna et al. | 711/108 |
| 2003/0056001 A1 * | 3/2003 | Mate et al. | 709/238 |
| 2003/0065879 A1 * | 4/2003 | Krishna et al. | 711/108 |
| 2003/0108043 A1 | 6/2003 | Liao | 370/392 |
| 2003/0188090 A1 | 10/2003 | Darnell et al. | 711/108 |
| 2004/0024757 A1 * | 2/2004 | Park et al. | 707/3 |
| 2004/0093462 A1 * | 5/2004 | Roth et al. | 711/108 |

* cited by examiner

*Primary Examiner*—Mano Padmanabhan
*Assistant Examiner*—Paul Baker
(74) *Attorney, Agent, or Firm*—Dorsey & Whitney LLP

(57) ABSTRACT

The disclosed system and method describe a ternary CAM device having, in addition to a data entry and a ternary mask entry, one or more additional control words which can specify a net mask length and status, a table identifier, and/or a validity word to specify a detailed status of the segmented data words stored. This allows for the matching of ternary CAM device entries with a comparand without sorting ternary CAM device entries. Additional status words can be used for table identification to save space in the actual data word entries, and also allowing for matching of data entries with selected table identifiers, precluding having to search the entire ternary CAM array. Additional status words can also be used to provide additional state information to provide more flexibility in validity checking. The disclosed system and method can be used in ternary CAM devices having and/or supporting varying word widths.

23 Claims, 5 Drawing Sheets

TERNARY CONTENT ADDRESSABLE MEMORY WITH ENHANCED PRIORITY MATCHING

TECHNICAL FIELD

The present invention is related generally to the field of semiconductor memory devices. More particularly, the present invention is related to content addressable memory systems and methods.

BACKGROUND OF THE INVENTION

Content Addressable Memory (CAM) devices are used in applications requiring matching operation on bit patterns, such as table lookup applications used by routing and switching systems in computer network applications. Typically, CAM devices provide for the direct comparison of stored data entries with a supplied value to be compared, called a comparand, in a single access. In contrast, when using conventional Random Access Memory (RAM) for the same search operation, stored data entries are compared by supplying the address of each of the stored data entries to the RAM device, retrieving each of the data entries stored at each of the addresses, and passing the data to an arithmetic logic unit (ALU), where it is then compared to the comparand. CAM devices, on the other hand, allow the comparand to be directly compared with all the stored data entries simultaneously, and any stored data entries matching the input entry generate a match signal. More specifically, each bit position of the comparand is compared with the corresponding bit positions of data entries stored in the CAM device. A priority encoder in the CAM device identifies which matching data entry is output first in the case of multiple matching data entries, with this data entry being termed the highest priority match, as will be explained later in this document.

FIG. 1 shows a conventional CAM device 100. The CAM device 100 is directed by control logic 104, which can conventionally write or retrieve data from the CAM array 108 by accessing an address decoder 112 through an address bus 116. Data to be conventionally written to or retrieved from the CAM array 108 are provided to input/output (I/O) buffers 120, which receive and supply data through a system bus 124. The control logic 104 directs the I/O buffers 120 through a control bus 128, and data is passed between the I/O buffers 120 and the CAM array 108 through a data bus 132. The CAM device may be operated as a conventional random access memory device using just these functional elements to write and retrieve data from the CAM array 108 by the control logic 104 specifying address information to the CAM array 108 through the data bus 132.

The primary differentiator between conventional random access memory (RAM) devices and CAM devices is the ability of CAM devices to perform search or matching operations in a deterministic time period as previously described, regardless of the number of data entries stored in the CAM array. Instead of the control logic 104 directing data access to the CAM array 108 through the address decoder 112, a comparand can be moved to the Comparand Register 136, and the control logic 104 then directs the CAM array 108 to compare all data entries to the data in the Comparand Register 136. All matching data entries are prioritized by the Priority Encoder 140, which determines which matching entry is the highest priority match.

An additional component of the CAM device 100 is the Mask Register 144. This is a global mask register in that it applies equally to all data entries in the CAM array 108 per compare operation. The Mask Register 144 holds a data mask which is used to identify which bits in the data entries stored in the CAM array 108 are considered significant, and thus compared to the same bit locations in the Comparand Register 136. For example, if the bit width of the data stored in the CAM array 108 is less than the native bit width of the CAM array 108, the Mask Register 144 is invoked to include only those bits significant to the application in the compare operation. In the case of multiple data entries matching the data in the comparand register 136, the Priority Encoder 140 determines which entry is output first. In a typical CAM device 108, the Priority Encoder 140 selects the matching entry with the lowest physical address as the highest priority match. Note that typical CAM devices may have several global mask registers; each invoked for a different compare, write or read operation, and only invoked one at a time.

The CAM device 100 heretofore described is termed a binary CAM device because the matching operations for each bit across the CAM array 108, aside from those bits indicated as not significant by the mask stored in the mask register 144, will yields one of two states: match or no match. This is often called an exact match, as all non-globally masked bits of the stored entry must match the data in the comparand register 136 before the entry will indicate a match.

A ternary CAM device allows for matching operations which will yield, for each bit across its CAM array, one of three states: match, no match, or "don't care". This third, don't care state is supported by each entry in the CAM array having its own individual, or local mask. This allows a third state to be specified individually for each bit of each data entry in the ternary CAM array 200, as shown in FIG. 2A. For each data entry 204 in the data portion 208 of the ternary CAM array 200, shown arranged from a low address 0 to a high address N, there is an associated mask 212 in the mask portion 216 of the ternary CAM array 200.

FIG. 2B shows a four-bit example of a ternary CAM array 250, and how the entries in the mask portion 254 affect the compare operation for each data entry in the data portion 258 for an example comparand of "1000". Entries in the mask portion 254 specify a one for each bit that is significant in the compare operation, and a zero for each bit that is not significant, which forces a match for that bit location. In a compare operation with the comparand value of 1000, combining the data entries with their local masks, there are three matching entries and two no match entries in the ternary CAM array 250. Starting at the low address data entry 1001 at address 0 with the mask value of 1111, there is a no match condition. Although the first three most significant bits match, the mask of 1111 makes all the bits significant in the comparison, and the least significant bit does not match. The next data entry at address 1 contains the value 1000, and is a perfect or exact match. The corresponding mask value is 1111, making all of the data bits significant for the compare operation, so the data value needs to match the comparand value exactly to indicate a match.

By contrast, the data entry at address 2, with a value of 1011, when combined with the data mask value of 1100, will yield a match with the value of 1000 in the comparand because only the two most significant bits are compared, and the two least significant bits are a forced match. Similarly, the data value in address three of 1110, when combined with a mask value of 1100 will yield a no match with the value of 1000 in the comparand because the second most significant bit of the data does not match, and the mask value indicates this bit position as significant. Finally, at address N., the data value of 1111, when combined with the mask value of 1000 yields a match with the value of 1000 in the comparand because only the most significant bit is being compared, and they match.

The priority encoders employed in typical ternary CAM devices will resolve multiple matches by returning the matching location with the lowest physical address first. In the previous example, where addresses 1, 2, and N matched, the ternary CAM will respond with the location address 1 as the highest priority match. In applications, this requires that the data stored in the ternary CAM array be ordered by the value of the mask, with higher priority values having lower physical addresses within the ternary CAM array. In applications where the mask may have interleaved ones and zeros, the designer must decide what determines priority, and sort the data appropriately before storing in the ternary CAM array. It is important to note that all data entries with a common mask value will comprise a block of data values within the ternary CAM array when sorted by mask value. It is not necessary to further sort the data entries within each block For most computer networking applications, the networking protocols specify the priority of multiple matching entries by the value of the mask. These protocols simplify the issue of determining priority and sorting by defining valid mask values that do not allow interleaved ones and zeros in the mask, and always include some minimum number of bits starting with the most significant data bit. This masking technique is often referred to as the network mask, or net mask.

In the previous example of FIG. 2B, the best match is the location with the longest string of ones in the mask, and having matching data in the significant bit positions. The ultimate match is an exact match with a mask value of all ones, as in address 1 of FIG. 2B. If address 1 was empty, so there would not be an exact match, the best match would be at address 2 because two most significant bits are being compared as opposed to one significant bit in address N, even though both locations would register a match. Note that in FIG. 2B, the mask value in address 3 would be an illegal net mask because it contains interleaved ones and zeros.

A typical networking application is a router. A network message received by a router might be targeted to all devices serviced by a second router connected to the first router. The devices connected to the second router have thirty-two bit addresses with the first twenty-four bits being identical. Because the message is directed to all the devices serviced by the second router, the first router is only concerned with identifying packets destined for the second router, regardless of where the second router sends the packets. The first router could keep a copy of all the network addresses of all of the devices connected to the second router, but that is an inefficient use of memory space within the first router. What the routing protocols allow is for the first router to represent all of the devices serviced by the second router with a single entry in its routing table. The entry would be stored with the value of the twenty-four identical network address bits in the most significant bits of the thirty-two bit address space, and zeros in the least significant eight bits. The corresponding mask value would be all ones in the first twenty-four bit positions, and zeros in the remaining eight bit positions. Any incoming packet to the first router with a destination address having the most significant twenty-four bits matching this entry will be forwarded to the second router, regardless of the value in the least significant eight bits.

In reality, a network router is connected to several other routers, which in turn, are connected to yet more routers, as well as end devices such as personal computers and servers. Each router connected to the first router may have one or more blocks of addresses that can be represented with one entry in the routing table of the first router, but with differing numbers of common significant bits. This means that the first router will have a variety of different net masks within its routing table; from a mask value of all ones for exact matches for end devices connected directly to this router, to a mask with few ones. These entries need to be sorted by net mask length, with the longest net mask entries at the lowest physical addresses within the CAM device, which takes processing power and time. The network space tends to be very dynamic, so this table may need to be resorted frequently, again taking processing power and time, potentially causing the ternary CAM device to not be available for a search operation when it is needed.

In conventional ternary CAM devices, gaps or empty entries are left in each net mask block of entries. This allows routers to update the routing table by inserting a new entry in an available empty location within the correct block without having to re-sort the entire table each time a new entry is inserted. Although this improves entry insertion time, it clearly wastes available resources by reserving ternary CAM array space for possible future use.

Another concern with conventional ternary CAM design is that the presentation of a comparand for a priority matching operation necessitates a search of the entire ternary CAM array. The switching of many logic gates necessary for this operation is appreciable. Some comparands might be seeking to retrieve only data entries which refer to a common table to which multiple devices might be assigned. Typically, this table information is included in each data entry assigned to the common table. Incorporating the table identifier within the address represented in the data entry consumes additional bits within the data space. Moreover, because the data entries themselves must be searched to identify data entries included in the table, a full search of the entire CAM array must be made even if only addresses are assigned to a single table are needed. Finally, some conventional CAM arrays provide for address spaces much wider than conventional IPv4 32-bit addresses, and allow for data words in excess of 144 bits in width. These devices allow for the segmentation of the native data word width of the CAM device into half-words and quarter-words when addresses short of the maximum word width are being used. Even when these words are empty or partially empty, a priority matching operation still will necessarily involve a search of the entire CAM array.

What is desired is a way to avoid having to use and occupy system resources in sorting and resorting data entries to support conventional priority matching protocols. What also is desired is a way to eliminate searching an entire ternary CAM array when the comparand seeks information, such as addresses assigned to a single, common table, or when only some of the word width in an extended width ternary CAM is used.

SUMMARY OF THE INVENTION

The present invention is directed to an improved ternary CAM device having, in addition to a data entry and a ternary mask entry, one or more additional control words which can specify a net mask length and status, a table identifier, and/or a validity word to specify a detailed status of segmented data words stored. This allows for the priority matching of the ternary CAM device entries with a comparand without sorting the data entries stored in the ternary CAM device. In addition, the additional status words can be used for table identification to not only save space in the actual device entries, but also allows for matching of data entries with selected table identifiers, precluding the need to search the entire ternary CAM array.

DETAILED DESCRIPTION OF THE INVENTION

Embodiments of the present invention are directed to an improved ternary CAM system and method, improving efficiency and reducing power consumption of the ternary CAM. In the following detailed description of exemplary embodiments of the invention, reference is made to the accompanying drawings, which form part hereof, and in which are shown, by way of illustration, specific exemplary embodiments in which the invention may be practiced. These embodiments are described in sufficient detail to enable those skilled in the art to practice the invention. However, it will be clear to one skilled in the art that the invention may be practiced without these particular details. Other embodiments may be utilized and modifications may be made without departing from the spirit or scope of the present invention. The following detailed description is, therefore, not to be taken in a limiting sense, and the scope of the present invention is defined only by the appended claims.

Figure 2B:
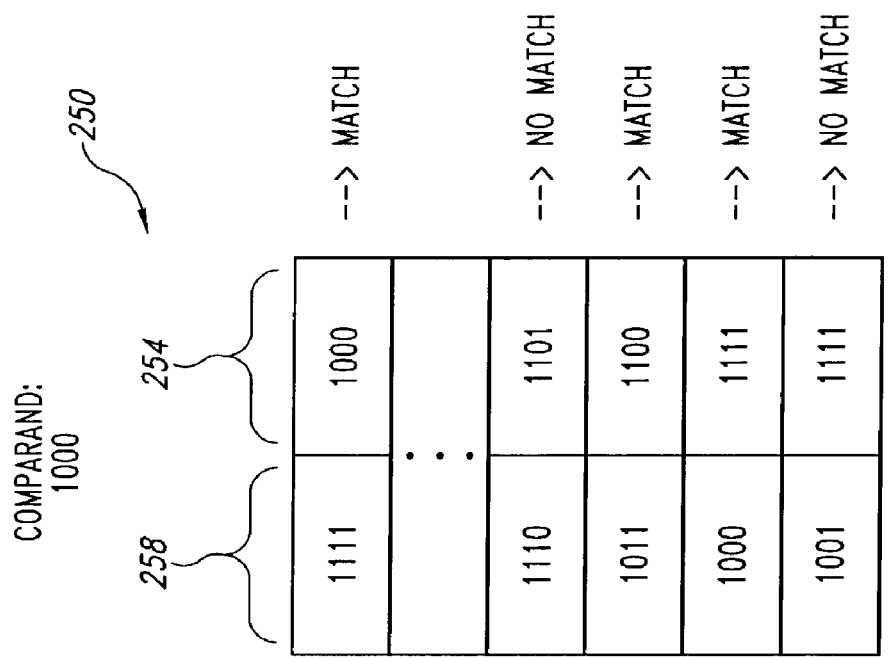
FIG. 2B is a table depicting a conventional ternary CAM array storing exemplary data words and associated mask words to depict the operation of the conventional ternary CAM device.
Figure 2A:
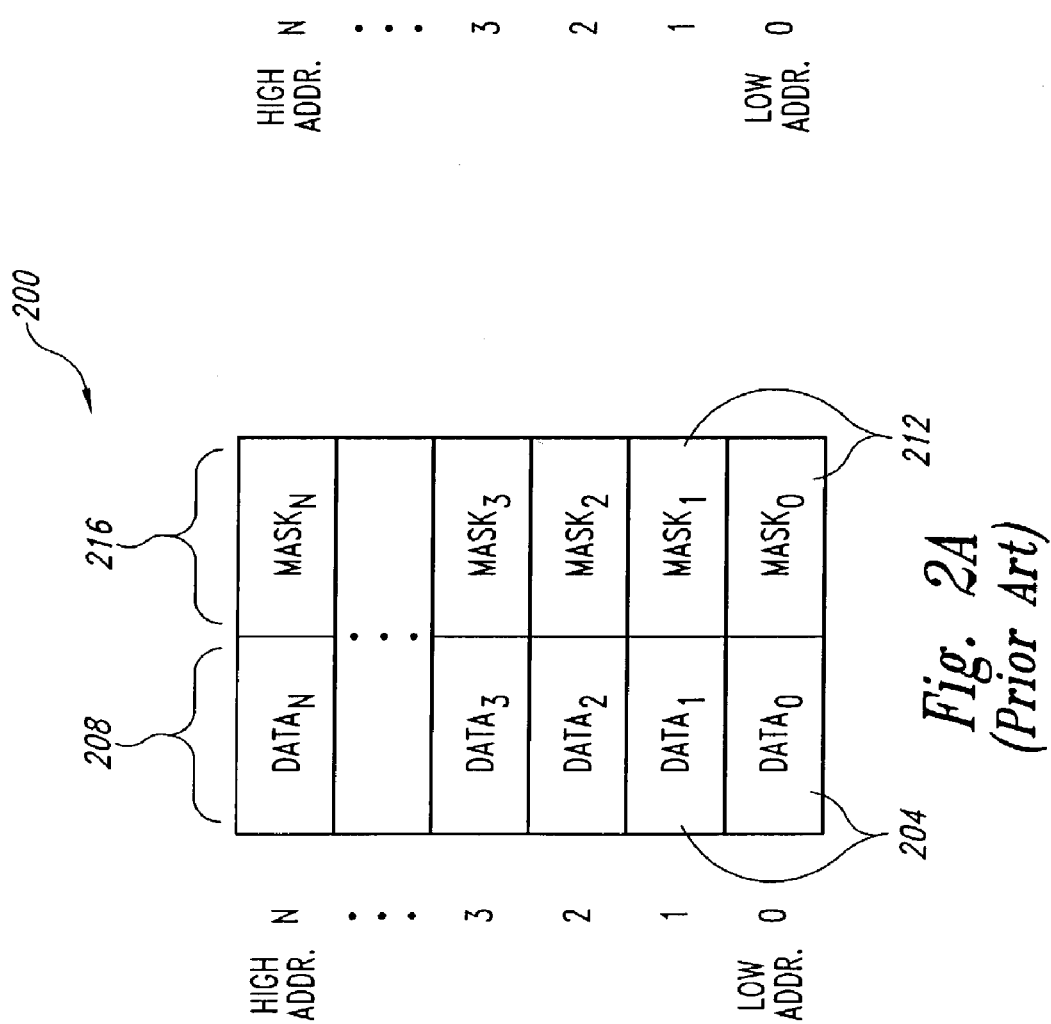
FIG. 2A is a table depicting a conventional ternary CAM array storing data words and associated mask words.
Figure 3:
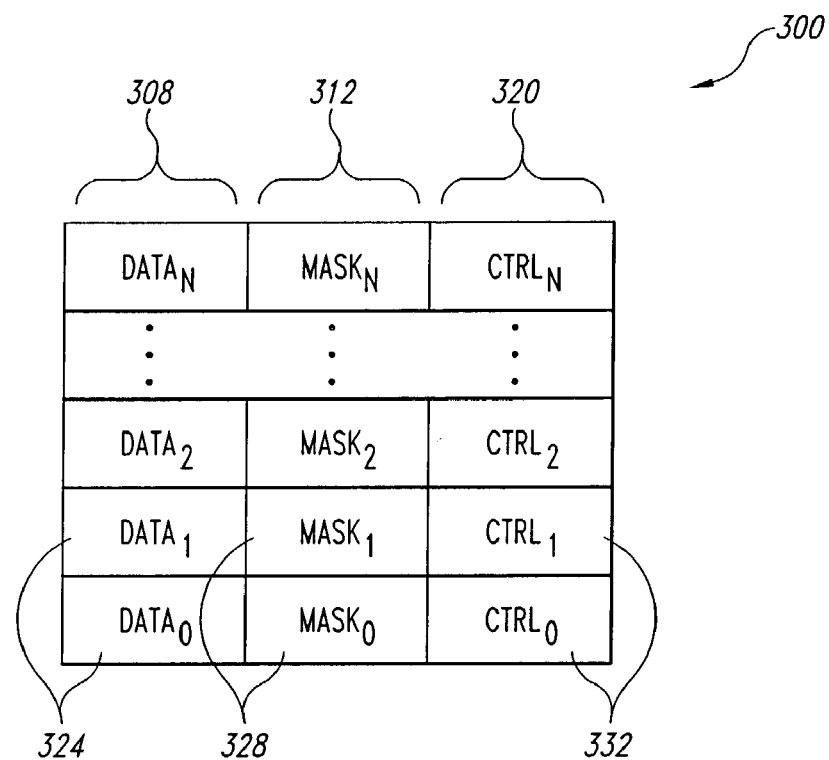
FIG. 3 is a table depicting a ternary CAM array storing according to an embodiment of the present invention showing data words, associated mask words, and control words.

FIG. 3 is a table representing an expanded ternary CAM array 300 in accordance with an embodiment of the present invention. Comparing FIG. 3 with FIGS. 2A and 2B, it can be seen that the expanded ternary CAM array 300, in addition to having a data portion 308 and a mask portion 312, further comprises a control portion 320. Thus, for each data entry 324 in the expanded ternary CAM array 300, in addition to an associated mask 328, one or more control words 332 is included. The masks 328 can comprise of net mask values having ranges of contiguous ones and zeros as previously described, or can contain interleaved zeros and ones for other masking applications. In embodiments of the present invention, the control words 332 associated with each data entry 324, may comprise net mask length control words, table address control words, sets of segmented word status flags, or other information. As will be further explained, inclusion of these control words can improve efficiency and reduce power consumption in ternary CAM applications.

Figure 4A:
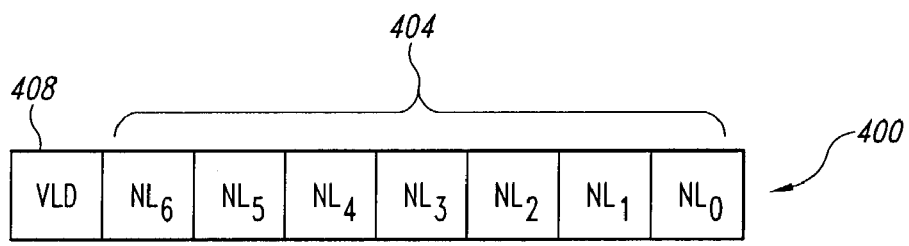
FIG. 4A is a table depicting a net mask length control word that may comprise a control word in accordance with an embodiment of the present invention.

FIG. 4A shows a control word 332 (FIG. 3) in the form of a net mask length control word 400. In this embodiment, the net mask length control word 400 is used to facilitate priority matching. As previously described, priority matching schemes frequently determine the highest priority match among multiple matching candidates by choosing the data entry having the net mask with the most significant (i.e., "do care") bits. Generally, net masks do not have interleaved zeros and ones, but comprise a number of ones listed from the left most significant bit positions to the left, and a number of zeros listed from the right in the least significant bit positions. As a result, the net masks with the greatest number of most significant bits, or "do care" bits, are the longest net masks. As also previously described, this scheme is facilitated by sorting data entries so that the data entries with the longest associated net masks appear in the lowest physical addresses in the memory space. Thus, if more than one data entry registers a match with the comparand, the highest priority match is determined as occupying the lowest memory address of all matching candidates.

Figure 1:
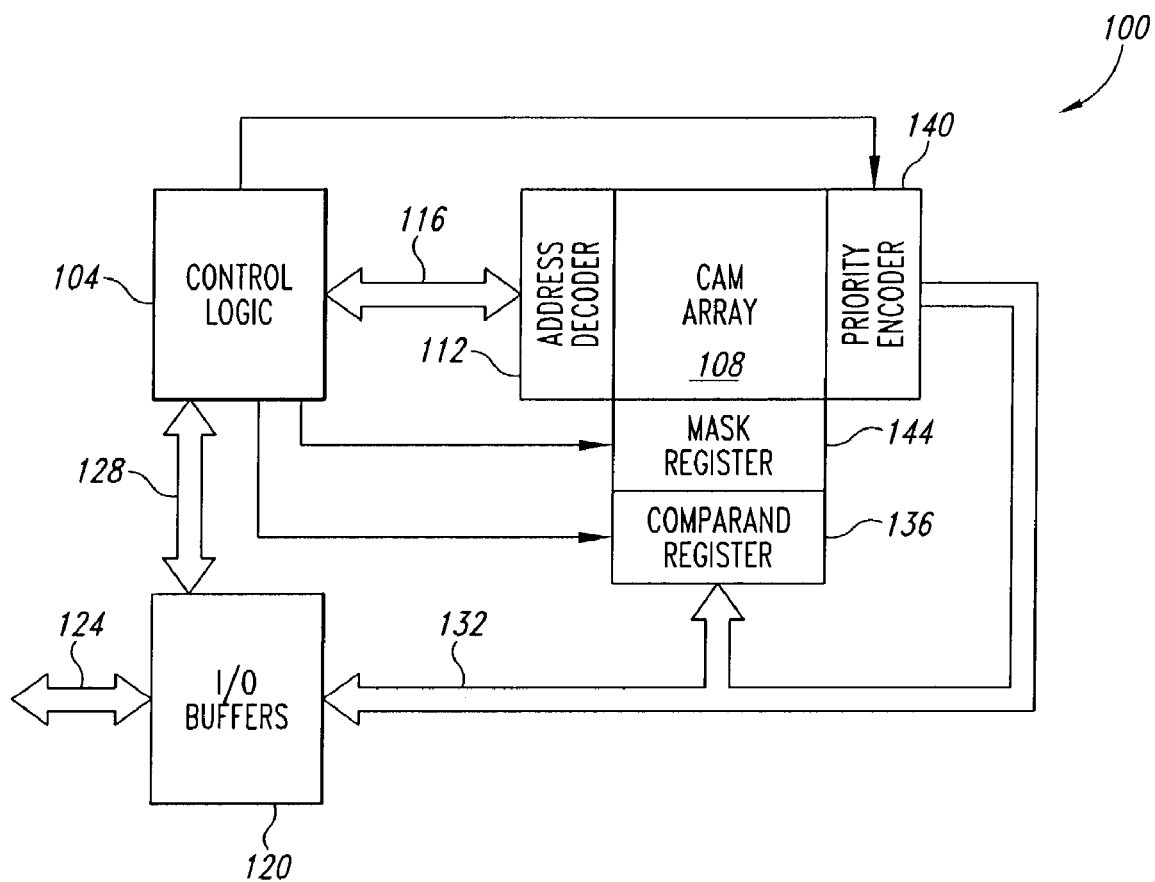
FIG. 1 is a block diagram of a conventional content addressable memory (CAM) device.

Using the net mask length control word 400 to specify the length of the net mask, data entries no longer have to be resorted by net mask length. Instead, as part of the matching process, the priority encoder 140 (FIG. 1) can compare the net mask length control words to determine the highest priority match from multiple matching data words. This saves the processing time and power required to sort the data entries, as well as usable time lost while this process is taking place.

More specifically, the net mask control word 400 comprises eight bits: a seven-bit net mask length specifier 404, comprised of bits NL0 through NL6, and a word validity bit 408, which indicates whether the control word is valid. Bits NL0 through NL6 represent a value indicative of the bit boundary where the net mask changes from one to zero. The net mask length value would define the number of most significant bits that are compared in a matching operation, with the remaining bits being a forced match. Accordingly, the seven bits contained in the net mask length specifier 404 can indicate a net mask length of up to one hundred twenty eight bits in length, accommodating conventional net masks. For example, bits NL0 through NL6 contain the net mask length, starting bit position 127 of the net mask and extending towards bit position 0. Note that a net mask length specifier of seven bits is sufficient to mask all one hundred twenty eight bits of an Internet Protocol version 6 (IPv6) address. Conventionally, there are a minimum number of significant bits of the network address that must be included in a match operation for the match operation to meet the requirements of the network protocols.

The validity bit 408 indicates whether the net mask length control word 400 is actually a valid net mask length. For example, as previously explained, net masks do not contain interleaved ones and zeros, as compared to conventional ternary CAM mask words, which may contain interleaved ones and zeros. If the mask word is a special purpose mask word containing interleaved ones and zeros, or is simply not used, the validity bit 408 will specify a zero, and the priority encoder 140 (FIG. 1) will not use the net mask length control word in a matching operation. However, if the net mask length is valid, the validity bit 408 will specify a one, and the priority encoder 140 (FIG. 1) will use the net mask length control word in matching operations to determine the highest priority match in the case of multiple matching candidates.

In one embodiment of the present invention, if the net mask control word 400 is a valid net mask length, the net mask corresponding to the net mask length is generated and used in the matching operation. Where the net mask control word 400 is an invalid net mask length, the corresponding ternary mask for that data word is loaded independently. It will be appreciated by those of ordinary skill in the art, however, that various modifications can be made to the embodiment previously described with respect to FIG. 4A without departing from the scope of the present invention. For example, alternative bit arrangements can be used, various number of bits representing the net mask length can be changed, and correspondence of bit positioning the net mask to the value of the net mask length can be modified and still remain within the present invention.

Figure 4B:
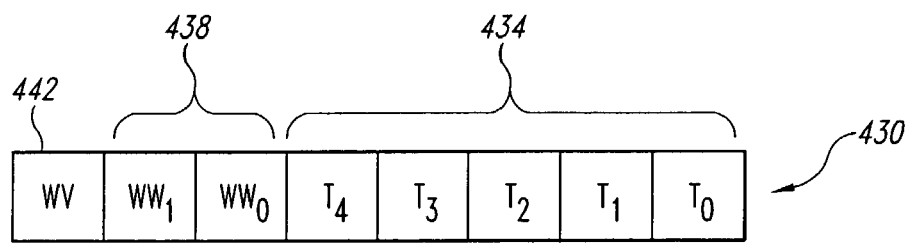
FIG. 4B is a table depicting a table identifier control word that may comprise a control word in accordance with an embodiment of the present invention.

Alternatively, the control word (FIG. 3) can specify a table address word 430, as shown in FIG. 4B, which specifies a table to which the associated address has been assigned. Thus, if one or more devices associated with a certain table identifier are the only devices for which a match would be desired, only data entries having that table identifier specified will be considered in the matching process. This affords two advantages: First, the table identifier information can be specified independently of the data word, therefore data word space need not be set aside for table identifier information. Second, if only data words having a particular table identifier are of interest in the matching process, only data entries included in that table need be evaluated in the matching process. As a result, fewer data entries need to be evaluated in the matching process, saving circuit switching and the power that would be consumed in that process.

As shown in FIG. 4B, an embodiment of the table identifier control word 430 comprises a five-bit table identifier 434, including bits T0 through T4, resulting in potentially defining 32 different tables. The table identifier control word 430 also specifies the data word and corresponding mask word segmentation of the table as defined by the two table word bit widths 438, WW0 and WW1. The data word width is defined by specifying the number of equal-sized segments within a word. For example, where 144-bits are allocated for each data word, "00" might define one 144-bit segment. However, where WW0 and WW1 are "10", there would be four 36-bit segments per data word, and "11" would be indicative of two 72-bit segments per word. Finally, the table identifier control word 430 comprises a word validity bit 442 to indicate with a zero or one whether the table identifier control word is invalid or valid, respectively.

It will be appreciated by one ordinarily skilled in the art that the table identifier control word 430 previously described is merely one embodiment of the present invention, and that modifications can be made without departing from the scope of the present invention. For example, where it is desirable for a greater number of tables to be potentially defined, the number of bits representing the table identifier can be increased accordingly.

Once all members of a specific table have been identified by the table identifier 434, it is then possible to enable only those entries for a given search operation. That is, by knowing ahead of time to which table each word belongs, it is possible to exclude from a given search all data words that do not belong to the table being searched on a word-by-word basis. This eliminates the need for placing new entries within a specific range of the CAM address space, which is required in some conventional table management schemes. Moreover, use of the table address control word 430 eliminates the need for table identifications bits within the data word, thus recovering additional data bits for use in multi-table applications.

Figure 4C:
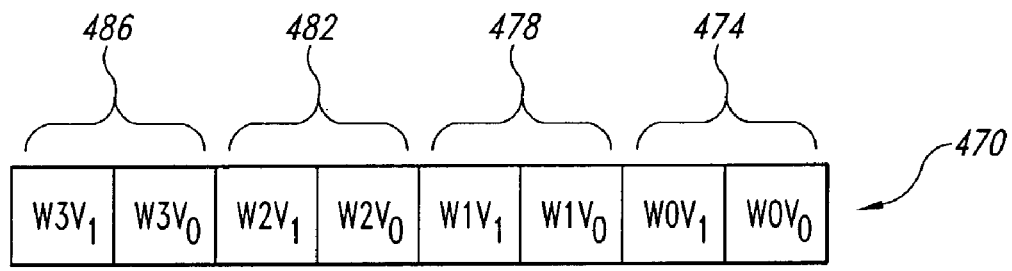
FIG. 4C is a table depicting a segmented word validity word that may comprise a control word in accordance with an embodiment of the present invention.

As shown in FIG. 4C, an embodiment of the invention might include a segmented word validity word 470. The segmented word validity word 470 can be used in conjunction with the table identifier control word 430 (FIG. 4B). A ternary CAM data word ordinarily might be 256-bits wide. However, the full 256 bits may not be required to store entries. Thus, the 256-bit data word can be segmented into multiple separate data words, some or all of which may be valid at any one time. The segmented word validity word 470, therefore, allows for different validity flags to be stored for each of the segmented words stored in that data entry. As shown in an embodiment depicted in FIG. 4C, if the data word can be segmented into four different data word segments, four pairs of validity bits 474, 478, 482, and 486, can be specified. For example, validity bit pair 474 comprises bits W0V0 and W0V1, specifying two validity bits for the first segment of the segmented word. Similarly, validity bit pair 478 comprises bits W1V0 and W1V1, specifying two validity bits for the second segment of the segmented word, and so on.

Use of the segmented word validity word 470 can provide greater flexibility in how to use and manage the data stored in each table in a CAM array. For example, upon finding a parity error for one of the data segments of a table, it may not be desirable to simply mark that segment as "empty". Having multiple validity states, as defined by the corresponding bits in the segmented word validity word 470, allows an entry to be temporarily excluded from searches without risk of having that segment overwritten in a subsequent write operation.

Figure 5A:
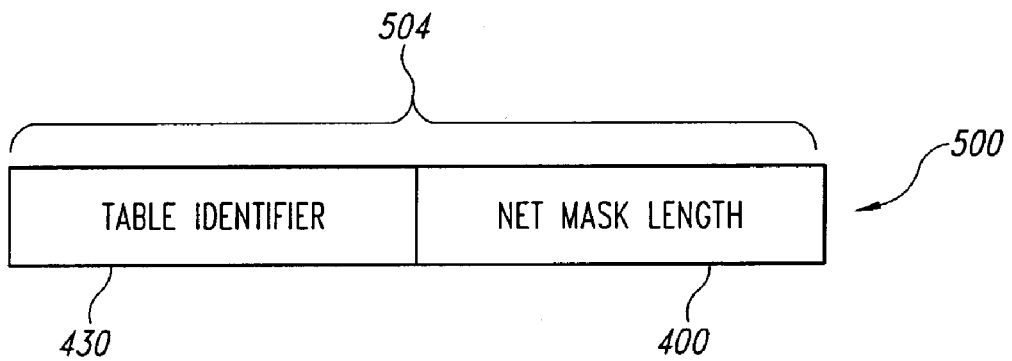
FIG. 5A is a table showing a control word comprising of both a net mask length control word and a table identifier control word that may comprise a control word in accordance with an embodiment of the present invention.
Figure 5B:
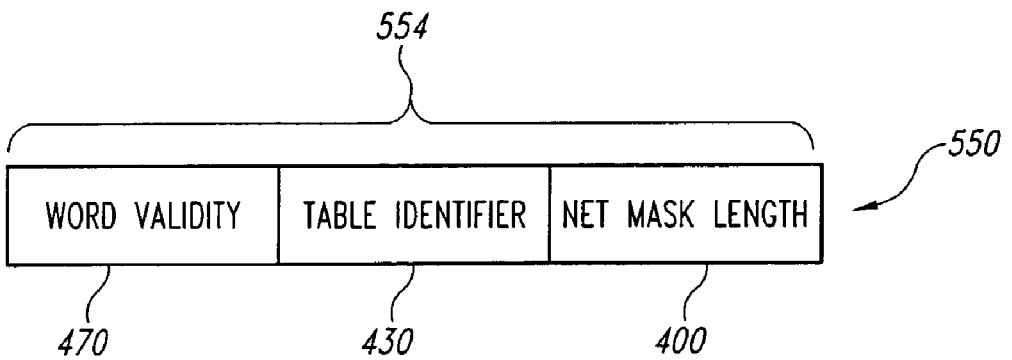
FIG. 5B is a table showing a control word comprising of a net mask length control word, a table identifier control word, and a segmented word validity word that may comprise a control word in accordance with an embodiment of the present invention.

Combinations of these control words may be used. For example, as briefly discussed above, the segmented word validity word 470 (FIG. 4C) and the table identifier control word 430 (FIG. 4B) provide additional flexibility when used in combination. FIG. 5A illustrates another combined use of control words. FIG. 5A shows a dual control word 500 that could comprise the control word 332 (FIG. 3). The control word 500 is a dual width word 504 having a net mask length word 400, like that shown in FIG. 4A, and a table identifier word 430, as shown in FIG. 4B. Having both of these control words allows for advantages of both as previously described. For example, priority matching could be performed according to net mask length without having to resort data entries, and data entries belonging to only a specific table be included. Similarly, all three types of control words previously described could be used as shown in FIG. 5B. A triple-width control word 550 has a triple-width field comprised of a net mask length word 400 (FIG. 4A), a table identifier word 430 (FIG. 4B), and a segmented word validity word 470 (FIG. 5C). This combined control word allows for all of the advantages previously described.

Figure 6:
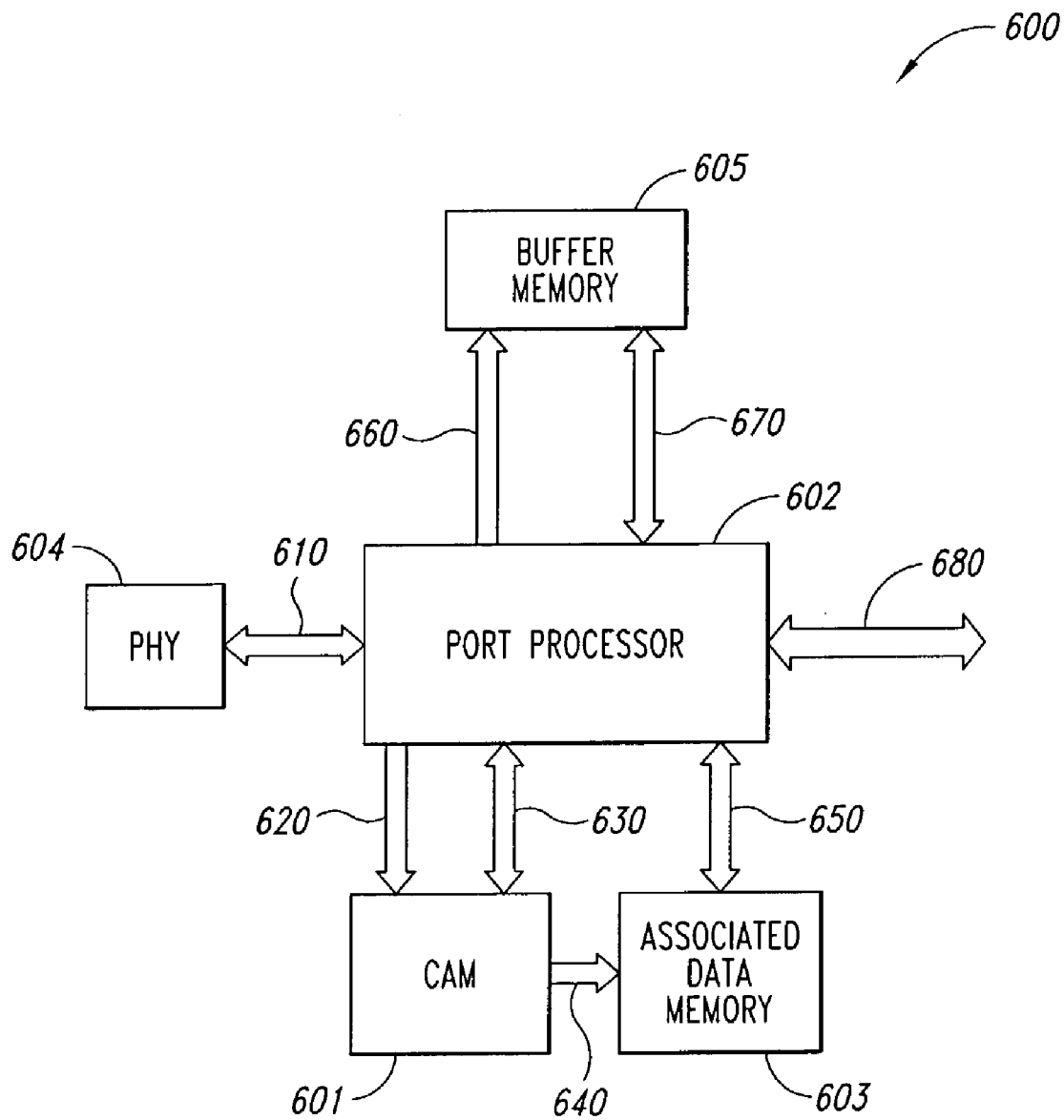
FIG. 6 is a block diagram of a computing system using one or more ternary CAM devices in accordance with an embodiment of the present invention.

FIG. 6 is a block diagram of a computer networking system incorporating an embodiment of the present invention. In the computer networking system 600, a port processor 602 is adapted with a preferred embodiment of the present invention (not shown) as previously described. The computer networking system 600, including the ternary CAM 601, utilizes a port processor 602 to perform various functions, calculations or tasks on the incoming and/or outgoing network traffic. In addition, the computer system 600 includes one or more input devices 604 that are generally coupled to the port processor 602 through a standard bus, such as MII (Media Independent Interface) or UTOPIA.

FIG. 6 is a block diagram for a subsystem 600 of a computer network device, such as a bridge, switch, router or access point, incorporating an embodiment of the present invention. The subsystem 600 consists of one or more PHY devices 604, or physical layer adaptation devices which interface the network device to the rest of the network; a port processor 602, which could be as simple as a collection of logic or as sophisticated as an Ethernet MAC (Media Access Controller) or network processor; a CAM device 601 in accordance with an embodiment of the present invention; packet or cell buffer memory 605; and optionally, associated data memory 603.

The PHY device 604 (or devices), in the receive or ingress direction, decode the incoming network traffic and present this traffic to the port processor 602 over a standard bus 610, such as MII (media independent interface) or UTOPIA. In the transmit or egress direction, the port processor 602 presents traffic destined for the network to the PHY device 604 over the data bus 610. The PHY device encodes the information for transmission over the rest of the network.

In the receive or ingress direction, the port processor 602 parses the incoming cell or frame to extract pertinent information from the header of the cell or frame. This extracted information is presented to the CAM 601 over the data bus 630, along with control information over the address and control bus 620. The data packet is sent to the buffer memory 605 for later processing or transmission over the system bus 680 to the rest of the system. The extracted information presented to the CAM 601 over the data bus 630, along with control information over the address and control bus 620 is compared with the data stored in the CAM device 601. The result, which is the combination of a match indication and data, provided the search was successful, will aid the port processor 602 in the decision making process of whether to accept an incoming frame or cell, and what to do with a frame or cell that is accepted. This result data may be stored and retrieved from the CAM device 601 itself, or may reside in optional associated data memory 603. If the result data is stored in the associated data memory 603, it is typical that the CAM device 601 directly controls the associated data memory 603 via the control bus 640, and the data itself is written to or read from the associated data memory 603 via the data bus 650 by the port processor.

In the egress or outbound direction, the port processor 602 receives the data packet and control information over the system bus 680, and may temporarily store the data packet in the buffer memory 605. Either a tag included in the data, or the control information presented to the port processor 602 will be presented to the CAM device 601 for a compare operation. The resulting data from the search operation will tell the port processor 602 which header to append onto the cell or frame before transmitting, and possibly the order in which the frames or cells leave the network device.

A host or system processor (not shown) is typically used to maintain the table or tables within the CAM device 601. This processor may be connected directly to the CAM device 601 or may manage and maintain the CAM device 601 through the port processor 602. As will be appreciated by one ordinarily skilled in the art, the more time spent on updating and managing the CAM 601, the less time there is for processing network traffic. There is an upper limit to obtaining faster processors and CAM devices, along with the negative of increased power consumption of the faster devices, to achieve improved network traffic processing performance. It will be further appreciated that embodiments of the present invention utilize additional control words to segment and prioritize the data stored within the CAM array, which in turn, streamlines the update and management tasks and time, and reduces power consumption.

It is to be understood that, even though various embodiments and advantages of the present invention have been set forth in the foregoing description, the above disclosure is illustrative only. Changes may be made in detail, and yet remain within the broad principles of the invention. For example, other types of combinations of the different control words described in FIGS. 4A, 4B, and 4C could be used than shown in FIGS. 5A and 5B. Similarly, the control words could be ordered differently than shown in FIGS. 5A and 5B. This, and other embodiments could make use of and fall within the principles of the invention. Thus, although specific embodiments of the invention have been described herein for purposes of illustration, and the invention is not limited except as by the appended claims.

What is claimed is:

1. A ternary content addressable memory device comprising:
   a. an array of content addressable memory cells arranged in data words for storage of data;
   b. an array of local or ternary mask words, each mask word being associated with a data word, the mask word storing a mask used to indicate which of a plurality of bits in the data word are significant; and
   c. an array of control words, each control word being associated with a data word, the control word comprising additional information about the data word comprising a mask word length indicator representing a mask length of the mask word associated with the data word and a mask word length validity indicator indicating whether the mask word length indicator is valid for priority matching operations, the control word used to facilitate matching of the data words with a comparand applied to the ternary content addressable memory device by analyzing the information represented in the control words associated with the data words.

2. The ternary content addressable memory device of claim 1 wherein each entry in the array of control words further comprises a table identifier specifying a table with which the data word is associated, and a table identifier validity indicator reflecting whether the table identifier is valid for matching operations.

3. The ternary content addressable memory device of claim 2 wherein the table identifier further comprises a data table width indicator indicating whether a match operation on a specified table is for a segmented or non-segmented data word table.

4. The ternary content addressable memory device of claim 1 wherein each entry in the array of control words further comprises a data word validity indicator specifying a validity status for each of the plurality of data word segments stored in a data word.

5. The ternary content addressable memory device of claim 4 wherein the data word validity indicator comprises at least two bits, such that more than two validity states can be specified for each of the plurality of data word segments stored in the data word.

6. In a ternary content addressable memory storing thereon a data structure, the data structure comprising:
   a. a data field containing data representing at least one data segment, the data segment compared to a comparand during a matching operation;
   b. a mask field containing data representing a mask word associated with the data segment, the mask word having a first portion defining a portion of the data segment to be evaluated in the matching operation and further having a second portion defining a portion of the data segment ignored during a matching operation; and
   c. a control field containing data representing a bit boundary of the mask word, the bit boundary defining the first and second portions of the mask word, the control field further containing data representing validity of the data representing the bit boundary of the mask word.

7. The data structure of claim 6, further comprising:
   a. a table identifier field containing data identifying a table to which the data in the data field is associated; and
   b. a segment validity field containing data representative of the data state for each data segment of the data field.

8. The data structure of claim 7 wherein the table identifier field further contains data representing the number of equal-sized data segments contained in the data field.

9. A memory system comprising:
   a. a memory controller;
   b. a memory bus operably coupled with the memory controller to communicate memory commands from the memory controller and communicate memory output signals to the memory controller; and
   c. a plurality of ternary CAM devices, each ternary CAM device comprising
      i. an array of content addressable memory cells arranged in data words for the storage of data;
      ii. an array of mask words, each mask word being associated with a data word, the mask word storing a mask used to indicate which of a plurality of bits in the data word are significant; and
      iii. an array of control words, each control word being associated with a data word, the control word storing the comprising additional information about the data word comprising a mask word length indicator representing a mask length of a mask word associated with the data word and a mask length validity indicator reflecting whether the mask word length indicator is valid for priority matching operations, the control word used to facilitate matching of the data words with a comparand applied to the ternary content addressable memory device by analyzing the information represented in the control words associated with the data words.

10. The memory system of claim 9 wherein each entry in the array of control words further comprises a table identifier a table with which the data word is associated, and a table validity indicator reflecting whether the table identifier is valid for matching operations.

11. The memory system of claim 10 wherein the table identifier further comprises a table width indicator specifying the width of the data structure of that table.

12. The memory system of claim 9 wherein each entry in the array of control words further comprises a validity indicator specifying a validity status for each of a plurality of data word segments stored in a data word.

13. The memory system of claim 12 wherein the validity indicator comprises at least two bits, such that more than two validity states can be specified for each of the plurality of data word segments stored in the data word.

14. A computer system comprising:
   a. a processor;
   b. an input device operably connected to the processor, allowing data to be entered into the computer system;
   c. an output device, operably connected to the processor, allowing data to be output from the computer system;
   d. at least one ternary CAM devices, each ternary CAM comprising:
      i. an array of content addressable memory cells arranged in data words for storage of data;
      ii. an array of mask words, each mask word being associated with a data word, the mask word storing a mask used to indicate which of a plurality of bits in the data word are significant; and
      iii. an array of control words, each control word being associated with a data word, the control word comprising additional information about the data word comprising a mask word length indicator representing a mask length of the mask word associated with the data word and a mask word length validity indicator reflecting whether the mask word length indicator is valid for priority matching operations, the control word used to facilitate matching of the data words with a comparand applied to the content addressable memory device by analyzing the information represented in the control words associated with the data words.

15. The computer system of claim 14 wherein each entry in the array of control words further comprises a table identifier specifying a table with which the data word is associated, and a table validity indicator reflecting whether the table identifier is valid for priority matching operations.

16. The computer system of claim 15 wherein the table identifier further comprises a data table width indicator specifying the bit width of the table indicated by the table identifier.

17. The computer system of claim 14 wherein each entry in the array of control words further comprises a data word validity indicator specifying a validity status for each of a plurality of data word segments stored within a data word.

18. The computer system of claim 17 wherein the data word validity indicator comprises at least two bits, such that more than two validity states can be specified for each of the plurality of data word segments stored in the data word.

19. A method for accessing a ternary content addressable memory device, the ternary content addressable memory device having an array of content addressable memory cells arranged in data words for storage of data, and an array of mask words, each mask word being associated with a data word, the mask word storing a mask used to indicate which of a plurality of bits in the data word are significant, the method comprising:
   a. Specifying for each of the data words a mask word length field containing information specifying a mask length of the mask word associated with the data word and a mask word length validity status field containing information reflecting whether the mask word length field is a valid field for priority matching operations; and
   b. Using the information contained in the mask word length and the mask word length validity status field to facilitate matching of the data words with a comparand applied to the ternary content addressable memory device by analyzing information represented in the mask length and mask word length validity status fields.

20. The method of claim 19, further comprising specifying a table identifier field and a table identifier validity status field containing information reflecting whether the table identifier field is a valid field for matching operations.

21. The method of claim 20, further comprising specifying the width of the data table indicated by the information contained by the table identifier field.

22. The method of claim 19, further comprising specifying a data word validity field for each of a plurality of data word segments stored in the data word.

23. The method of claim 22, further comprising specifying at least two bits of validity information in the data word validity field, such that more than two validity states can be specified for each of the plurality of data word segments stored in the data word.

* * * * *